United States Patent
Griffith et al.

(10) Patent No.: US 6,970,039 B2
(45) Date of Patent: Nov. 29, 2005

(54) EFFICIENCY ENHANCEMENT FOR MMIC AMPLIFIERS

(75) Inventors: Jonathan Paul Griffith, Gainsville, GA (US); Brittin C. Kane, Clermont, FL (US); Michael W. Trippe, Norcross, GA (US)

(73) Assignee: Anadigics, Norcross, GA (US)

( * ) Notice: Subject to any disclaimer, the term of this patent is extended or adjusted under 35 U.S.C. 154(b) by 19 days.

(21) Appl. No.: 10/692,232

(22) Filed: Oct. 23, 2003

(65) Prior Publication Data
US 2004/0085134 A1 May 6, 2004

Related U.S. Application Data

(60) Provisional application No. 60/420,703, filed on Oct. 23, 2002.

(51) Int. Cl.⁷ .................................................. H03F 3/68
(52) U.S. Cl. .................... 330/124 R; 330/295; 330/296; 330/302
(58) Field of Search .............................. 330/107, 124 R, 330/286, 295, 302, 296

(56) References Cited

U.S. PATENT DOCUMENTS 5,568,086 A * 10/1996 Schuss et al. ........... 330/124 R

* cited by examiner

Primary Examiner—Steven J. Mottola
(74) Attorney, Agent, or Firm—Tucker, Ellis & West LLP

(57) ABSTRACT

The present innovation is directed to a single-chip integrated circuit power amplifier configured to employ the efficiency enhancement techniques utilized in Doherty amplifiers. The single-chip integrated circuit power amplifier may be implemented using uniquely designed biasing circuits as described herein. Also, the use of combined HBT/FET processes and a lumped quarter-wavelength transformer may be inherently well suited for the implementation of Doherty amplifiers in the single-chip techniques described herein.

14 Claims, 2 Drawing Sheets

EFFICIENCY ENHANCEMENT FOR MMIC AMPLIFIERS

RELATED APPLICATIONS

The present application is related to and claims priority benefit of the filing date of a U.S. provisional patent application titled: EFFICIENCY ENHANCEMENT FOR MMIC AMPLIFIERS; Ser. No. 60/420,703, filed Oct. 23, 2002, which is hereby incorporated by reference into the present application.

BACKGROUND

The present innovation is generally directed toward Monolithic Microwave Integrated Circuit (MMIC) power amplifiers. More specifically, the present innovation is directed to a method for creating a single-chip MMIC or RFIC using the principles of a Doherty power amplifier.

The principle of Doherty amplifiers was shown as early as 1936. However, practical designs utilizing a single RFIC have not been feasible in earlier implementations. This patent application is directed toward unique features to allow the possibility of a single-chip RFIC using the principal of a Doherty power amplifier.

Power amplifiers are typically less efficient as the output power is backed off from the maximum achievable output power.

The present invention is generally directed to the design and implementation of complex circuits to reduce distortion and linearize the output corresponding to radio frequency (RF) and microwave frequency ranges. An embodiment of the present integrated circuitry (IC) is configured to use a combination of bipolar transistors, FETs and resonant circuits to effectively provide lineariztion and dynamic power control for RF and microwave signals. Feasible combinations of bipolar transistors and FETs include GaAs Heterojunction Bipolar Transistors (HBTs) with PHEMTs, as well as Silicon Germanium Bipolars with CMOS.

Today, one problem with operating a power amplifier at low distortion levels is that the efficiency of the amplifier circuit is greatly reduced because it is not amplifying at its highest capability. Therefore, a circuit according to the present system can preferably utilize a bias circuit to adjust the bias characteristics and subsequent power amplification corresponding to changing circuit conditions.

Specifically, in one embodiment, a bias circuit may preferably utilize a leakage current of an RF input to determine the state of amplification and accordingly adjust the bias. By adjusting the bias conditions and power amplification characteristics to the existing conditions, power amplification efficiency is greatly improved.

Demands on the linearity and efficiency of power amplifiers are common in radio frequency and microwave communication systems. Conventionally, power amplifiers normally operate at maximum efficiency at or near saturation. However, in order to accommodate the linearity of today's devices with communication signals having varying amplitudes (e.g. cellular telephones), systems utilizing conventional power amplifiers normally operate at less than peak efficiency for a substantial portion of the time.

Of course, in today's market, wireless communications devices, such as cellular telephones and wireless local area networks (WLAN), must consistently provide clear and undistorted transmissions. As well, the batteries in the devices must be small in physical size while maintaining a long operating life.

In order to meet these consumer requirements, wireless designers and engineers have moved away from using traditional silicon-based bipolar transistors in power amplifiers and toward using more exotic transistors, such as heterojunction bipolar transistors ("HBTs") made of aluminum-gallium-arsenide/gallium-arsenide ("AlGaAs/GaAs") and indium-gallium-phosphide/gallium-arsenide ("InGaP/GaAs"). Such HBTs provide outstanding power efficiency and high linearity, thus enabling wireless devices to achieve longer battery life and better signal characteristics for voice and data.

Additionally, the trend in data networks is to provide higher data rates with complex modulation schemes. Complex modulation schemes require the design and implementation of linear systems in order for data transmission to be successful. In most cases, linear system design places significant constraints on individual circuits within the system.

Quite often the modulated signals applied to the system have very high peak-to-average-power-ratio (PAPR) which requires the individual circuits in the system to be designed so that they can withstand a large range of power levels. Essentially, the individual circuits must be designed with a large dynamic range, which makes the circuits inefficient and expensive.

Ultimately, circuit linearization techniques provide solutions to problems associated with signals requiring large dynamic ranges. Earlier techniques that implement feedback, predistortion, feedforward, and other signal processing concepts have not been feasible for use in RFIC designs. The technique used in the one embodiment of the present innovation allows for linearization and dynamic power control to be implemented in RFICs by manipulating aspects of the bias circuitry and through a unique application of the mixture of device technologies now available on the same integrated circuit.

Thus, what is needed is an approach that achieves higher efficiency as a function of the power backoff than normal classes of power amplifiers.

SUMMARY

The present innovation is directed to a single-chip integrated circuit power amplifier configured to employ the efficiency enhancement techniques utilized in Doherty amplifiers. The single-chip integrated circuit power amplifier may be implemented using uniquely designed biasing circuits as described herein. Also, the use of combined HBT/FET processes and a lumped quarter-wavelength transformer may be inherently well suited for the implementation of Doherty amplifiers in the single-chip techniques described herein.

In accordance with one embodiment, an integrated circuit amplifier is provided that employs the principles and techniques of Doherty amplifiers. In accordance with alternate embodiments, the integrated circuit amplifier may be a monolithic microwave integrated circuit (MMIC) or a radio frequency integrated circuit (RFIC).

Specifically, the integrated circuit amplifier comprises a signal input for receiving an input signal (e.g. radio frequency (RF) input signal). A first amplifying element is provided to amplify the input signal. As well, a phase shifting element may be provided and operatively connected to receive the input signal. The phase shifting element may be operatively configured to shift the phase of the input signal by 90 degrees.

A second amplifying element is provided to receive the phase shifted signal from the phase shifting element and to amplify the altered signal accordingly. The second amplifying element may operatively include a bias circuit for biasing an amplifier transistor.

An impedance transformer element is provided to receive and alter the electrical characteristics of the output of the first amplifying element. The impedance transformer element may be a lumped element comprised of inductance and capacitance elements. Furthermore, the present innovation may be suitable configured to combine the outputs of the second amplifying element and the impedance transformer element.

BRIEF DESCRIPTION OF THE DRAWINGS

It will be appreciated that the illustrated boundaries of elements (e.g. boxes, groups of boxes, or other shapes) in the figures represent one example of the boundaries. One of ordinary skill in the art will appreciate that one element may be designed as multiple elements or that multiple elements may be designed as one element.

For a more complete understanding of the present system and the advantages thereof, reference is now made to the following description taken in conjunction with the accompanying drawings in which.

DETAIL DESCRIPTION OF THE DISCLOSED EMBODIMENTS

Among those embodiments and improvements that are disclosed herein, other embodiments and advantages of this invention will become apparent from the following description taken in conjunction with the accompanying drawings. The drawings constitute a part of this specification and include exemplary embodiments of the present invention and illustrate various objects and features thereof.

Throughout this description, the embodiments and examples shown should be considered as exemplars, rather than limitations, of the present innovation. Of course, these embodiments and examples are not intended to be limiting and other embodiments may be implemented without departing from the spirit and scope of the innovation.

Briefly describing one embodiment of the present system, it provides for a monolithic microwave integrated circuit (MMIC) including a main amplifier circuit and an auxiliary amplifier circuit. Generally, one embodiment of the circuit is configured to utilize an RF drive level to alter the electrical characteristics of a bias circuit surrounding an RF amplifier included within an auxiliary amplifier element in order to provide improved power efficiency at high levels of power backoff.

Figure 1:
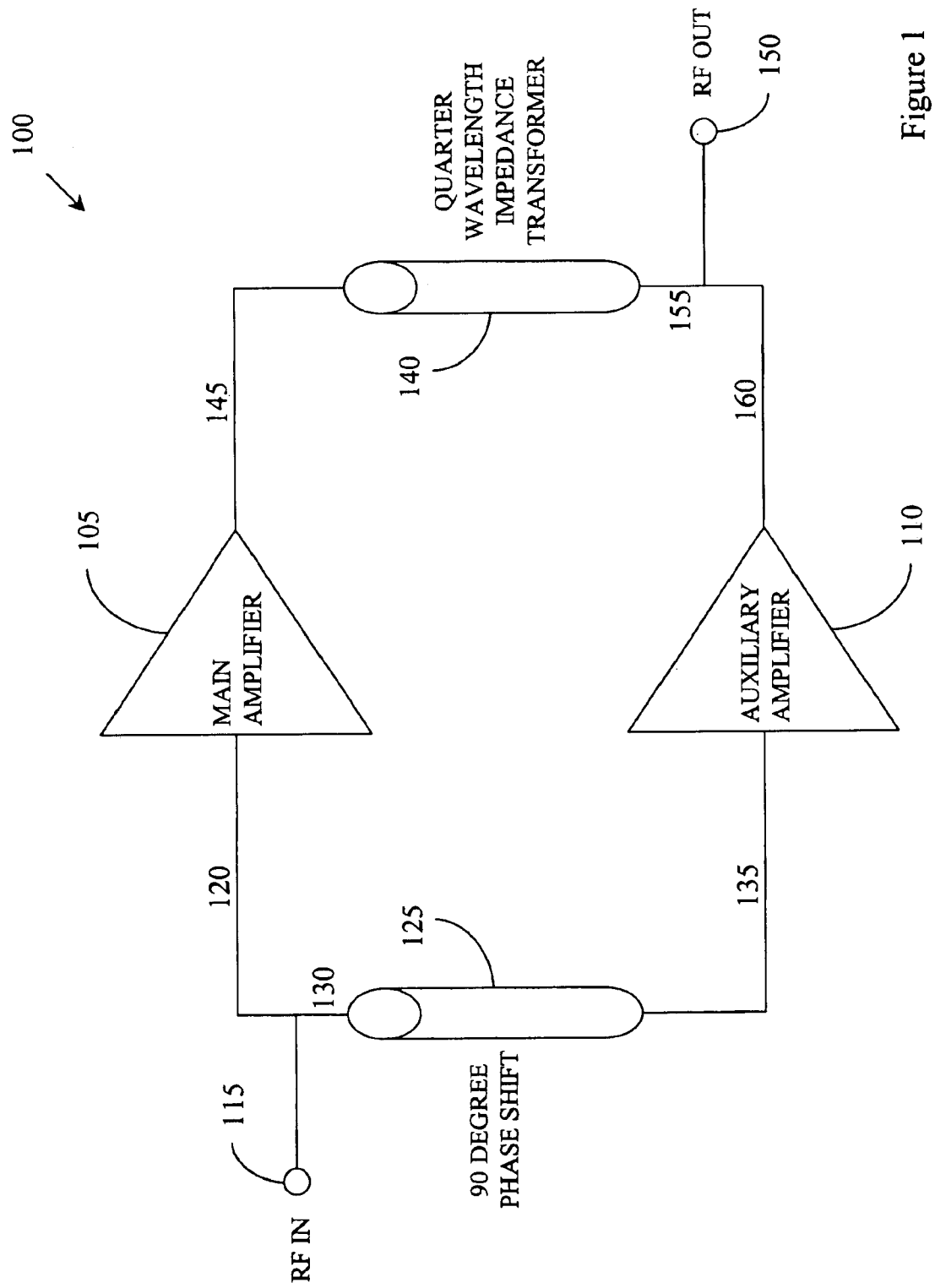
FIG. 1 is a component diagram of an RF amplifier circuit in accordance with one embodiment of present system.

Referring initially to FIG. 1, an embodiment of an MMIC in accordance with the present innovation is shown and generally designated 100. Generally, the embodiment includes a main amplifier element 105 and an auxiliary amplifier element 110.

As shown in FIG. 1, one embodiment of an MMIC includes a radio frequency (RF) signal input element 115 connected to an input of the main amplifier 105 via line 120 and to an input of a phase shift element 125 via line 130. It will be appreciated that the RF signal input element 115 may be any element capable of accepting an electrical signal known in the art.

The phase shift element 125 is operatively connected between the. RF signal input element 115 via line 130 and an input to the auxiliary amplifier 110 via line 135. In accordance with the embodiment, an impedance transformer element 140 is provided and operatively connected between the output of the main amplifier element 105 via line 145 and an RF signal output element 150 via line 155. To complete the circuitry of the MMIC of the embodiment, the output of the auxiliary amplifier element 110 is operatively connected to the RF signal output element 150 via line 160.

One embodiment of the present invention contemplates implementing the power amplifier circuit on a single RFIC chip utilizing bipolar transistors. For example, it will be appreciated that that the bipolar transistors may be heterojunction bipolar transistors ("HBTs") made of aluminum-gallium-arsenide/gallium-arsenide ("AlGaAs/GaAs") and indium-gallium-phosphide/gallium-arsenide ("InGaP/GaAs") or the like. For purposes of discussion, both types of HBT's (e.g. AlGaAs/GaAs and InGaP/GaAs) will be referred to as GaAs HBT's. The main amplifier may also be implemented in Silicon Germanium (SiGe) or other technologies known in the art.

In accordance with the preferred embodiment, a GaAs HBT amplifier and bias circuitry configuration may be advantageously employed and configured in the circuitry of the auxiliary amplifier element 135.

Because true class C bipolar transistor amplifiers are unavailable in a single supply voltage configuration, it will be understood and appreciated that on-chip control of the bias may be necessary to advantageously control the output characteristics of the RF signal output element 150.

With reference directed toward a GaAs HBT embodiment, the present circuit may be adapted to utilize a current ramping feature of an HBT bias network. In other words, the circuit 100 may be suitably configured to utilize an HBT bias network to control the operation of the auxiliary amplifier element 135 in a Doherty configuration.

Although the embodiment shown and described is directed toward an amplifier for use in a single chip GaAs/PHEMT HBT process, it will be appreciated that alternate embodiments may be employed without departing from the spirit and scope of the present innovation. For example, an artisan will understand that alternate implementations in silicon (e.g. SiGe/BiCMOS) processes and generic wafer processes may be employed without departing from the present innovation.

In other words, for implementation in SiGe/BiCMOS designs, the auxiliary amplifier may be implemented utilizing the complementary metal oxide semiconductor (CMOS) devices which are readily available in the art. It will be appreciated that the use of a CMOS-type semiconductor is a unique application of the available mixture of processes.

Referring again to the embodiment of FIG. 1, it will be understood that a transmission line or its equivalent may be suitably configured as the phase shift element 125 in order to provide the transformation of impedance between the main amplifier element 105 and the auxiliary amplifier element 135.

One embodiment generates the required equivalent inductance in lumped form. As an artisan can readily appreciate that there are several lumped form implementations which may be utilized. Additionally, one skilled in the art will appreciate that any lumped form technique may require implementing low loss inductors on-chip.

For example, one embodiment is directed toward a lumped form using a Shunt C/Series L/Shunt C approach. It will be appreciated that this approach may minimize the cross-sectional area of the chip. An artisan will appreciate that this approach may require for the inductor to have the lowest possible loss. In other words, in order to achieve an extremely low loss, the embodiment may implement this inductor by using all of the metal layers and corresponding interconnection bias.

It will be appreciated that an HBT, requires a direct-current ("DC") bias signal comprising both a voltage and a current to be applied to its input terminal to establish its operating point. The operating point of a transistor may be defined as the point on the transistor's characteristic curves at which the transistor will operate in the absence of an input signal.

Because changes in the DC bias signal affect the operation of an HBT, thus affecting the linearity of the amplifier, the DC bias signal must be unaffected by variations in temperature or in the power supply voltage. Such a DC bias signal is normally generated by a "bias circuit." In this embodiment, the DC bias may be suitably configured to be automatically compensated for the desired output power, corresponding to the principles of Doherty amplifier operation.

Continuing with the preferred embodiment of the present system, it provides for an auxiliary amplifier element 110. Generally, the auxiliary amplifier element 110 circuit may be suitably configured to utilize an RF drive level to alter the electrical characteristics of the auxilliary RF amplifier in order to provide improved efficiency at high levels of power backoff.

Figure 2:
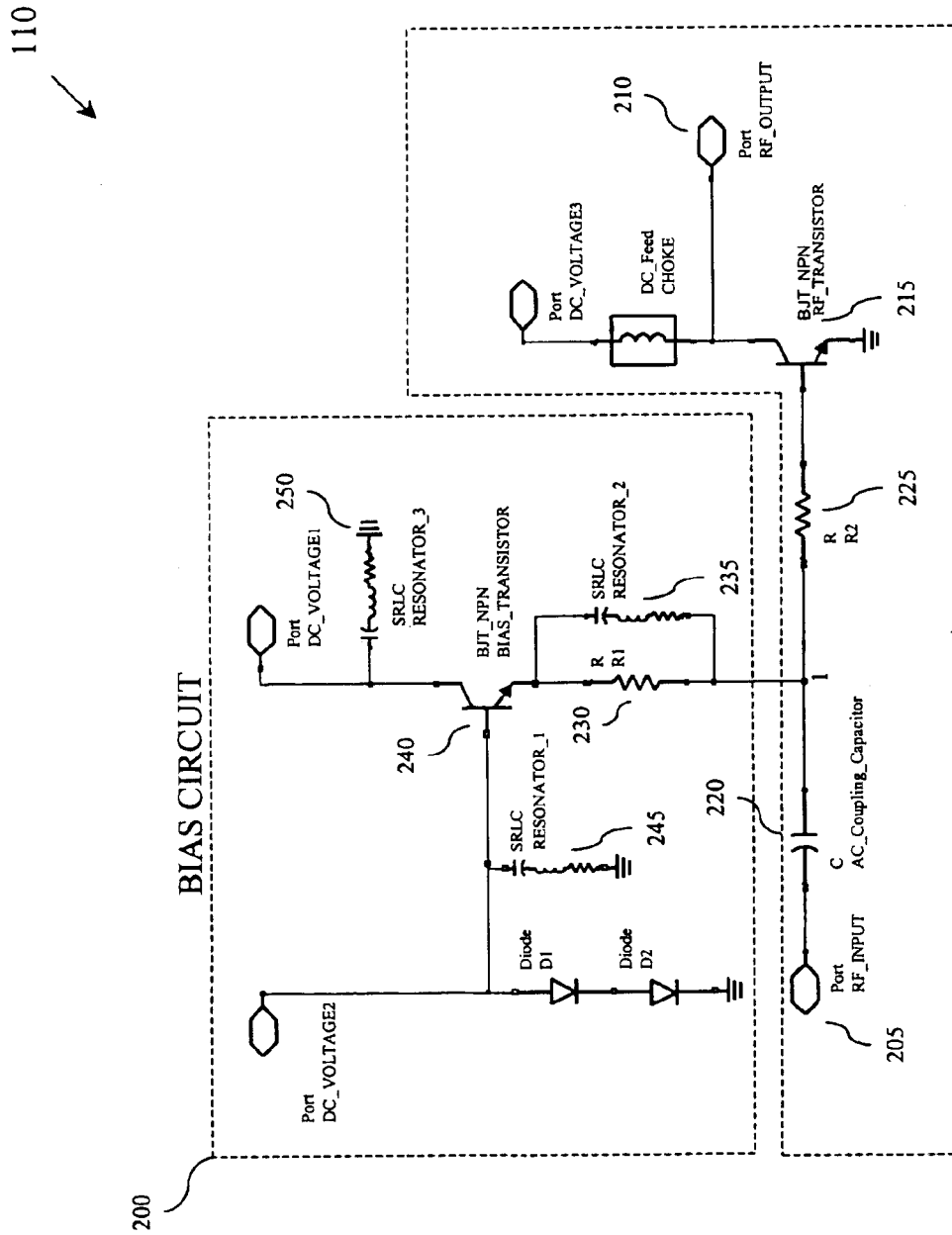
FIG. 2 is a circuit diagram of an RF auxiliary amplifier element including an impedance controlled bias circuit in accordance with one embodiment of the present system.

Illustrated in FIG. 2 is an embodiment of a bias circuit and auxiliary amplifier element 110 circuitry suitably configured in accordance with the present innovation. The circuitry shown in FIG. 2 includes a bias circuit 200 having various resistors, inductors and capacitors configured to suitably provide specific impedances at desired points to allow for optimized RF signal leakage into the bias circuit 200.

As a result of the optimized RF signal leakage, the bias circuit 200 can be suitably configured to linearize the RF output signal as well as provide bias point shifts. In doing so, the bias circuit is configured to allow for a wide dynamic range of output powers which are extremely linear while maintaining high efficiency.

Continued reference to FIG. 2 illustrates that an embodiment of the auxiliary amplifier element 135 generally provides a circuit design configured to utilize an RF input 205 and corresponding leakage to affect the performance of the bias circuitry 200. In other words, the basic operation of this embodiment utilizes an RF input signal leakage into the bias circuit 200 to provide a means to both linearize the RF output 210 and cause the bias current into the RF transistor 215 to increase with output power.

In operation, element 125 of FIG. 1 shifts the phase of the RF input signal 205 before it flows into the input of auxiliary amplifier element 110 of FIG. 1 from line 135. The input signal 205 flows through the AC Coupling Capacitor 220 and R2 225 and into the base of the RF transistor 215.

Additionally, an RF input signal leakage flows into the bias circuit 200 at terminal 1. An artisan will appreciate that the amount of RF input signal leakage entering the bias circuit 200 at terminal 1 may be suitably controlled by a combination of the impedance of both the resistor R1 230 as well as the Resonator 2 235.

Next, the RF input signal leakage flows through both a bias transistor 240 base to emitter diode junction as well as a bias transistor base to collector diode junction. As shown in FIG. 2, the configuration of bias transistor 240 permits the RF input signal leakage flow into the emitter terminal of bias transistor 240 from the parallel impedance configuration or R1 230 and Resonator 2 235.

The Resonator 1 245 and Resonator 3 250 provide controlled impedances that prompt the RF input leakage signal to shift the bias point by utilizing the bias transistor's diode junctions.

Referring again to FIG. 1, the output 210 of FIG. 2 is combined with the amplified output of the impedance transformer element 140 to produce the RF output element 150.

It will be appreciated that although the embodiment described herein discloses a bias circuit utilizing an HBT-type transistor, other types of transistors known in the art may be used without departing from the scope of the embodiments. For instance, alternative embodiments may use npn-type or pnp-type BJTs, other varieties of HBTs, or field-effect transistors ("FETs").

In summary, it will be appreciated that the present embodiment incorporates a multitude of techniques into the circuitry to manipulate the HBT bias operating point. Furthermore, it will be appreciated that these manipulation techniques may permit the present technology to be implemented in RFIC processes.

Of course, it will be understood that the present system may be used in applications where the characteristics of the power amplifier circuit can be modified to compensate for changing conditions. One example of an implementation where compensation for changing conditions obtains benefits is a power amplifier circuit in a cellular telephone.

One skilled in the art will recognize that the power amplification requirements of a cellular telephone change in accordance with the conditions under which the telephone is operating. For example, when the telephone operates in a region that provides poor cellular coverage, high-power cellular signals are required to communicate with the base station. In a region with better cellular coverage, signals can be lower power because the base stations are closer. Regions of good cellular coverage are now readily available, and high efficiencies at the required lower output powers result in improved battery life.

While the present invention has been illustrated by the description of embodiments thereof, and while the embodiments have been described in considerable detail, it is not the intention of the applicants to restrict or in any way limit the scope of the appended claims to such detail. It is obvious that equivalent alterations and modifications will become apparent to others skilled in the art upon the reading and understanding of this specification. The present invention includes all such equivalent alterations and modifications.

Therefore, the invention, in its broader aspects, is not limited to the specific details, the representative apparatus, and illustrative examples shown and described. Accordingly, departures may be made from such details without departing from the spirit or scope of the applicant's general inventive concept.

We claim:

1. An integrated circuit amplifier comprising:
   a signal input element for receiving an input signal;
   a main amplifying element having an input and an output wherein the input is operatively coupled to receive the input signal;
   a phase shifting element having an input and an output wherein the input is operative connected to receive the input signal and the phase shifting element is suitably adapted to create a phase shifted signal from the input signal;

an auxiliary amplifying element having an input and an output wherein the input is operatively coupled to receive the phase shifted signal from the phase shifting element;

an impedance transformer element having an input and an output wherein the input is operatively coupled to receive the main amplifier output; and a signal output element coupled to the output of the auxiliary amplifier and the output of the impedance transformer element for providing an output of the integrated circuit amplifier, wherein the auxiliary amplifying element includes a bias circuit for biasing an amplifier transistor having a control terminal, a current-sink terminal, and a current-source terminal;

wherein the bias circuit comprises:

a bias transistor including a control terminal, current-sink terminal, and a current-source terminal;

a first DC input port connected to the current sink terminal of the bias transistor;

a first resonator element operatively coupled to the current-sink terminal of the bias transistor and ground;

a second DC input port connected to the control terminal of the bias transistor;

a diode element operatively coupled to the control terminal of the bias transistor and ground;

a second resonator element operatively coupled to the control terminal of the bias transistor and ground; and a resistive element operatively coupled to the current source terminal of the bias transistor and the control terminal of the amplifier transistor.

2. The integrated circuit of claim 1 wherein the integrated circuit is a monolithic microwave integrated circuit (MMIC).

3. The integrated circuit of claim 1 wherein the integrated circuit is a radio frequency integrated circuit (RFIC).

4. The integrated circuit amplifier of claim 1 wherein the input signal is an RF input signal.

5. The integrated circuit amplifier of claim 1 wherein the phase shifting element is a 90 degree phase shifting element.

6. The integrated circuit amplifier of claim 1 wherein the impedance transformer element is a quarter wavelength impedance transformer element.

7. The integrated circuit amplifier set forth in claim 1, wherein the impedance transformer is a lumped element of inductance and capacitance elements.

8. The circuit as set forth in claim 1 wherein the bias transistor is one of a BJT, an HBT and a FET.

9. The circuit as set forth in claim 1 wherein the amplifier transistor is one of a BJT, an HBT and a FET.

10. The circuit as set forth in claim 1 wherein the first resonator is an RLC circuit.

11. The circuit as set forth in claim 1 wherein the diode element comprises a plurality of diodes.

12. The circuit as set forth in claim 1 wherein the second resonator is an RLC circuit.

13. The circuit as set forth in claim 1 wherein the resistive element is a resistor.

14. The circuit as set forth in claim 1 wherein the resistive element is an RLC circuit.

* * * * *